US012640535B2

(12) United States Patent
Yamaji et al.

(10) Patent No.: US 12,640,535 B2
(45) Date of Patent: May 26, 2026

(54) OPTICAL TRANSMISSION MODULE

(71) Applicant: Mitsubishi Electric Corporation,
Tokyo (JP)

(72) Inventors: Kazuki Yamaji, Tokyo (JP); Norio Okada, Tokyo (JP)

(73) Assignee: Mitsubishi Electric Corporation,
Tokyo (JP)

( * ) Notice: Subject to any disclaimer, the term of this patent is extended or adjusted under 35 U.S.C. 154(b) by 1093 days.

(21) Appl. No.: 17/754,328

(22) PCT Filed: Dec. 4, 2019

(86) PCT No.: PCT/JP2019/047329
§ 371 (c)(1),
(2) Date: Mar. 30, 2022

(87) PCT Pub. No.: WO2021/111534
PCT Pub. Date: Jun. 10, 2021

(65) Prior Publication Data
US 2022/0344895 A1      Oct. 27, 2022

(51) Int. Cl.
*H01S 5/02212* (2021.01)
*H01S 5/0231* (2021.01)
*H01S 5/0235* (2021.01)

(52) U.S. Cl.
CPC ........ *H01S 5/02212* (2013.01); *H01S 5/0231* (2021.01); *H01S 5/0235* (2021.01)

(58) Field of Classification Search
CPC .. H01S 5/02212; H01S 5/0231; H01S 5/0235; H01S 5/06213; H01S 5/02253;
(Continued)

(56) References Cited

U.S. PATENT DOCUMENTS

2004/0037334 A1    2/2004  Funada et al.
2005/0013561 A1    1/2005  Kuhara et al.
(Continued)

FOREIGN PATENT DOCUMENTS

CN          103515838 A      1/2014
JP        2004-146777 A      5/2004
(Continued)

OTHER PUBLICATIONS

Interview Agenda (Oct. 29, 2025).*
(Continued)

*Primary Examiner* — Fernando L Toledo
*Assistant Examiner* — Jorge Andres Lopez
(74) *Attorney, Agent, or Firm* — Studebaker Brackett PLLC

(57)          ABSTRACT

This optical transmission module includes: a plurality of semiconductor lasers provided on a sub-mount fixed to a side surface of a block fixed on a plate-shaped stem made of metal; and a cap with a lens fixed thereto, the cap covering all members placed above the stem. The same number of lead pins as the semiconductor lasers are provided so as to respectively penetrate through a plurality of holes formed in the stem. The lead pins and the semiconductor lasers are electrically connected to each other, respectively. Single-phase electrical signals with the stem as a ground potential are respectively applied to the semiconductor lasers from an external power supply, through the lead pins, respectively, so as to cause modulation and oscillation of the semiconductor lasers.

10 Claims, 20 Drawing Sheets

(58) Field of Classification Search
CPC .. H01S 5/0683; H01S 5/4031; H01S 5/02345;
H01L 23/02
See application file for complete search history.

(56) References Cited

U.S. PATENT DOCUMENTS

| | | | |
|---|---|---|---|
| 2005/0194663 A1 | 9/2005 | Ishimura | |
| 2007/0242712 A1* | 10/2007 | Funada | H01S 5/02453 |
| | | | 372/36 |
| 2012/0033696 A1* | 2/2012 | Hayashi | H01S 5/02235 |
| | | | 372/43.01 |
| 2020/0220322 A1 | 7/2020 | Takagi | |

FOREIGN PATENT DOCUMENTS

| | | | |
|---|---|---|---|
| JP | 2004-356233 A | 12/2004 | |
| JP | 2005-191088 A | 7/2005 | |
| JP | 2005-286305 A | 10/2005 | |
| JP | 2008-103774 A | 5/2008 | |
| WO | 2018/211635 A1 | 11/2018 | |

OTHER PUBLICATIONS

An Office Action; "Notice of Reasons for Refusal," mailed by the Japanese Patent Office on Mar. 7, 2023, which corresponds to Japanese Patent Application No. 2021-562242 and is related to U.S. Appl. No. 17/754,328; with English language translation.
An Office Action mailed by China National Intellectual Property Administration on Nov. 8, 2024, which corresponds to Chinese Patent Application No. 201980102476.7 and is related to U.S. Appl. No. 17/754,328; with English language translation.
International Search Report issued in PCT/JP2019/047329; mailed Mar. 3, 2020.

* cited by examiner

OPTICAL TRANSMISSION MODULE

TECHNICAL FIELD

The present disclosure relates to an optical transmission module.

BACKGROUND ART

A semiconductor laser for optical communication is formed as a module configured to, for outputting a modulated beam obtained by turning on and off a laser beam at high speed, not merely perform semiconductor laser oscillation but also receive an electrical signal for modulating a laser beam at high speed and output the modulated laser beam. One example of the module configuration is a CAN-package-type optical transmission module having a cylindrical CAN package (cap) in which a semiconductor laser capable of modulation is placed.

In such a CAN-package-type optical transmission module, in order to output laser beams with multiple wavelengths, proposed is a configuration in which a plurality of electro-absorption modulated laser diode (EML) elements for outputting laser beams having wavelengths different from each other are provided in one CAN package. In the CAN-package-type optical transmission module, voltage, current, or an electrical signal needs to be transmitted/received to/from an external power supply, a control circuit, and the like via lead pins. Therefore, in a case where a plurality of EML elements are provided in the CAN package, the number of lead pins increases as compared to a case of providing one EML element, thus hampering size reduction of the module. Accordingly, proposed is a configuration in which wires for connection with a power supply and for a control signal are provided coaxially at one lead pin, thus decreasing the number of lead pins (see Patent Document 1).

CITATION LIST

Patent Document

Patent Document 1: WO2018/211635A1

SUMMARY OF THE INVENTION

Problems To Be Solved By The Invention

In the CAN-package-type optical transmission module for optical communication described in Patent Document 1, the number of lead pins is decreased and thus size reduction of the package can be achieved. However, a GND of the lead pin is not located at the outermost coaxial layer. Therefore, the wire of the GND of the lead pin cannot be electrically connected directly to the package, and the wire of the GND needs to be led out from the coaxial lead pin, so that the impedance of the signal wire varies and the characteristics become unstable. In addition, the lead pin has a multilayer coaxial structure formed of an insulating layer and a conductive layer, and therefore manufacturing thereof is complicated, leading to cost increase.

The present disclosure has been made to solve the above problem, and an object of the present disclosure is to provide an optical transmission module that includes a plurality of semiconductor lasers and that simplifies manufacturing thereof, enables size reduction, and reduces variations in impedance.

Solutions to the Problems

An optical transmission module according to the present disclosure includes: a stem having a plate shape and made of metal; a block fixed to the stem; a sub-mount fixed to a side surface of the block; a plurality of semiconductor lasers provided at the sub-mount; and a cap with a lens fixed thereto, the cap covering all members placed above the stem. A plurality of lead pins whose number is the same as a number of the plurality of semiconductor lasers are provided so as to respectively penetrate through a plurality of holes formed in the stem. The plurality of lead pins and the plurality of semiconductor lasers are electrically connected to each other, respectively. Single-phase electrical signals with the stem as a ground potential are respectively applied to the plurality of semiconductor lasers from an external power supply, through the plurality of lead pins, respectively, so as to cause modulation and oscillation of the plurality of semiconductor lasers.

Effect of the Invention

The optical transmission module according to the present disclosure makes it possible to provide an optical transmission module that includes a plurality of semiconductor lasers and that simplifies manufacturing thereof, enables size reduction, and reduces variations in impedance.

DESCRIPTION OF EMBODIMENTS

Embodiment 1

Figure 1:
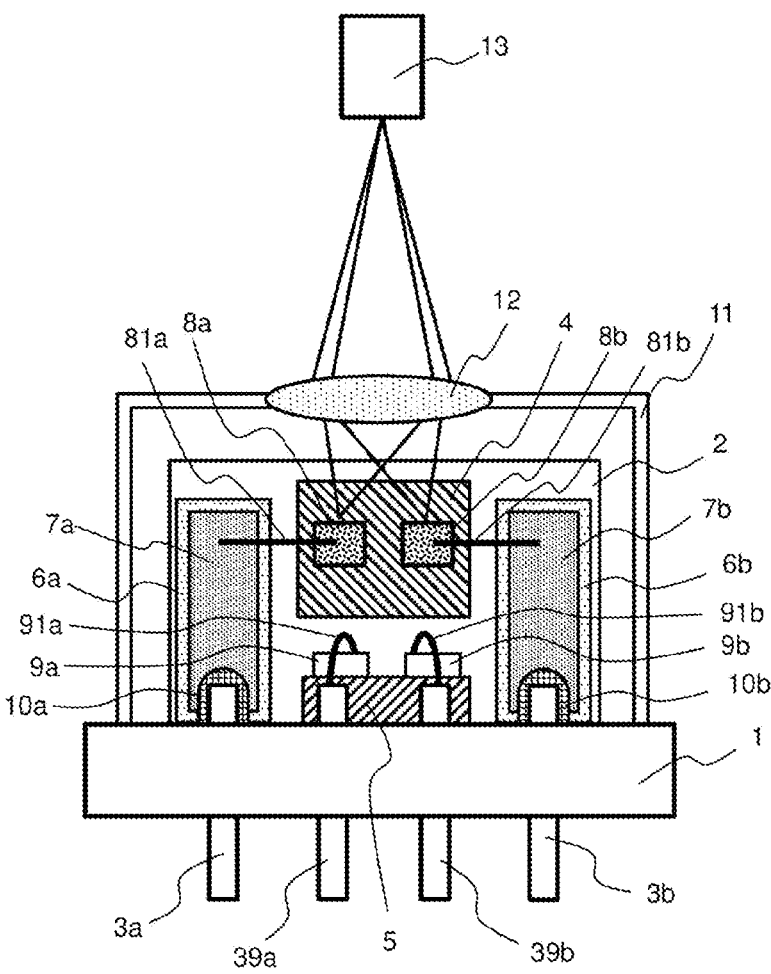
FIG. 1 is a side view showing the internal structure of an optical transmission module according to embodiment 1.
Figure 2:
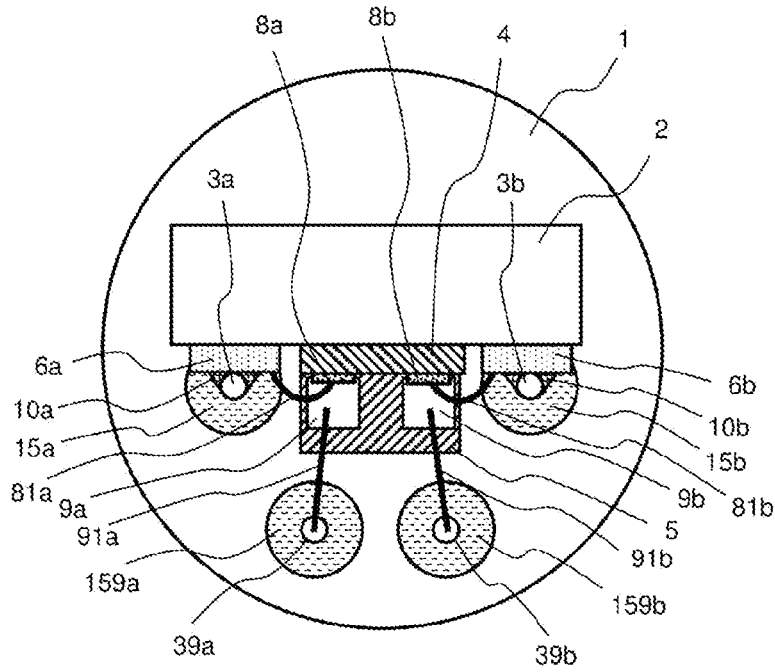
FIG. 2 is a top view showing the internal structure of the optical transmission module according to embodiment 1.

FIG. 1 and FIG. 2 are schematic views showing the structure inside a cap 11 of an optical transmission module according to embodiment 1. FIG. 1 is a side view and FIG. 2 is a top view. A block 2 is fixed on a stem 1 having a plate shape and made of metal, and a sub-mount 4 is mounted on one side surface of the block 2. Two semiconductor lasers, i.e., a semiconductor laser 8a and a semiconductor laser 8b, are mounted on the sub-mount 4. Two photodiodes, i.e., a photodiode 9a and a photodiode 9b, are mounted on a sub-mount 5 mounted on the stem 1. The photodiode 9a and the photodiode 9b are mounted such that light reception portions thereof are respectively positioned on optical axes of beams emitted from rear end surfaces of the semiconductor laser 8a and the semiconductor laser 8b, and are respectively used for monitoring output beams of the semiconductor laser 8a and the semiconductor laser 8b.

The stem 1 is provided with a lead pin 3a and a lead pin 3b via which voltages are respectively applied from an external power supply to the semiconductor laser 8a and the semiconductor laser 8b so that drive currents for oscillation flow therethrough. In addition, the stem 1 is provided with a lead pin 39a and a lead pin 39b for respectively electrically connecting the photodiode 9a and the photodiode 9b to the outside. These lead pins are formed by applying gold plating to an alloy containing iron, nickel, copper, etc. as main materials. Each lead pin penetrates the stem 1 and protrudes upward from the stem 1. Gaps between the stem 1 and the lead pins 3a, 3b, 39a, 39b are respectively filled with sealing materials 15a, 15b, 159a, 159b which are insulating materials, whereby the lead pins are insulated from the stem 1 and fixed to the stem 1.

A transmission board 6a and a transmission board 6b are mounted on a side surface of the block 2, and tips of the lead pin 3a and the lead pin 3b for semiconductor laser are respectively joined to pattern wiring 7a and pattern wiring 7b on the transmission board 6a and the transmission board 6b by conductive joining materials 10a, 10b such as solder or a conductive adhesive agent. The transmission boards are made of a dielectric material such as glass, alumina (Al$_2$O$_3$), or aluminum nitride (AlN). The pattern wiring 7a and the pattern wiring 7b, and the semiconductor laser 8a and the semiconductor laser 8b, are electrically connected to each other via a wire 81a and a wire 81b, respectively. The thickness of the dielectric board, the relative permittivity, and the pattern wiring are designed to have such a characteristic impedance value as to suppress reflection of an electrical signal.

In general, many circuits are designed with a line impedance of 50Ω. However, in a case of selecting the dimensions of the sealing materials, the lead pins, and stem holes considering airtight sealing of penetration parts of the lead pins, it is difficult to set the characteristic impedance at the lead pin part to 50Ω, and the characteristic impedance becomes around 25Ω. On the other hand, in a case where the semiconductor laser is a distributed feedback (DFB) laser, the impedance is normally several Ω to ten and several Ω. Therefore, using the lead pins in the above configuration facilitates impedance matching. Further, as compared to the configuration in Patent Document 1, the ground potential is stabilized and variations in impedance are reduced.

The photodiode 9a and the lead pin 39a are electrically connected via a wire 91a, and the photodiode 9b and the lead pin 39b are electrically connected via a wire 91b. On the back surface of the stem 1, a GND pin (not shown) is provided for electrically connecting the stem 1 to a ground potential portion (GND) of an external circuit.

The cap 11 is mounted on the stem 1, and components such as the block 2, the sub-mount 4, the sub-mount 5, the transmission board 6a, the transmission board 6b, the semiconductor laser 8a, the semiconductor laser 8b, the photodiode 9a, and the photodiode 9b are covered by the cap 11 so as to be stored inside the cap 11. Beams emitted from the semiconductor laser 8a and the semiconductor laser 8b are focused on one point through a lens 12 provided at an opening of the cap 11, and is introduced into one fiber 13. It is noted that the top view in FIG. 2 shows the structure inside the cap 11 in a state in which the cap 11 with the lens 12 fixed thereto is detached.

In the present embodiment 1, single-phase electrical signals with the GND as a reference are inputted from an external circuit to the lead pin 3a and the lead pin 3b, and are applied to the semiconductor laser 8a and the semiconductor laser 8b, whereby the semiconductor laser 8a and the semiconductor laser 8b oscillate in accordance with the respective electrical signals, to emit laser beams. The laser beams emitted from front end surfaces of the semiconductor laser 8a and the semiconductor laser 8b are focused via the lens 12, to be introduced into the fiber 13. Meanwhile, beams emitted from the rear end surfaces of the semiconductor laser 8a and the semiconductor laser 8b are respectively received by the photodiode 9a and the photodiode 9b, whereby the beam outputs of the semiconductor laser 8a and the semiconductor laser 8b can be monitored.

In the structure shown in FIG. 1 and FIG. 2, two semiconductor lasers are provided on one side surface of the block. However, the number of semiconductor lasers is not limited to two. More than two semiconductor lasers may be provided on one side surface of the block, a plurality of lead pins corresponding to the number of the semiconductor lasers may be provided to the stem, and single-phase electrical signals may be respectively applied from the lead pins to the semiconductor lasers.

Here, as shown in FIG. 1 and FIG. 2, in the case where two semiconductor lasers, i.e., the semiconductor laser 8a and the semiconductor laser 8b, are provided, arrangement from the lead pin 3a to the semiconductor laser 8a and arrangement from the lead pin 3b to the semiconductor laser 8b can be made line-symmetric as seen in the direction perpendicular to the side surface of the block 2 on which the sub-mount 4 and the like are mounted. By making line-symmetric arrangement as described above, the impedance from the lead pin 3a to the semiconductor laser 8a and the impedance from the lead pin 3b to the semiconductor laser 8b can be made equal to each other.

Figure 3:
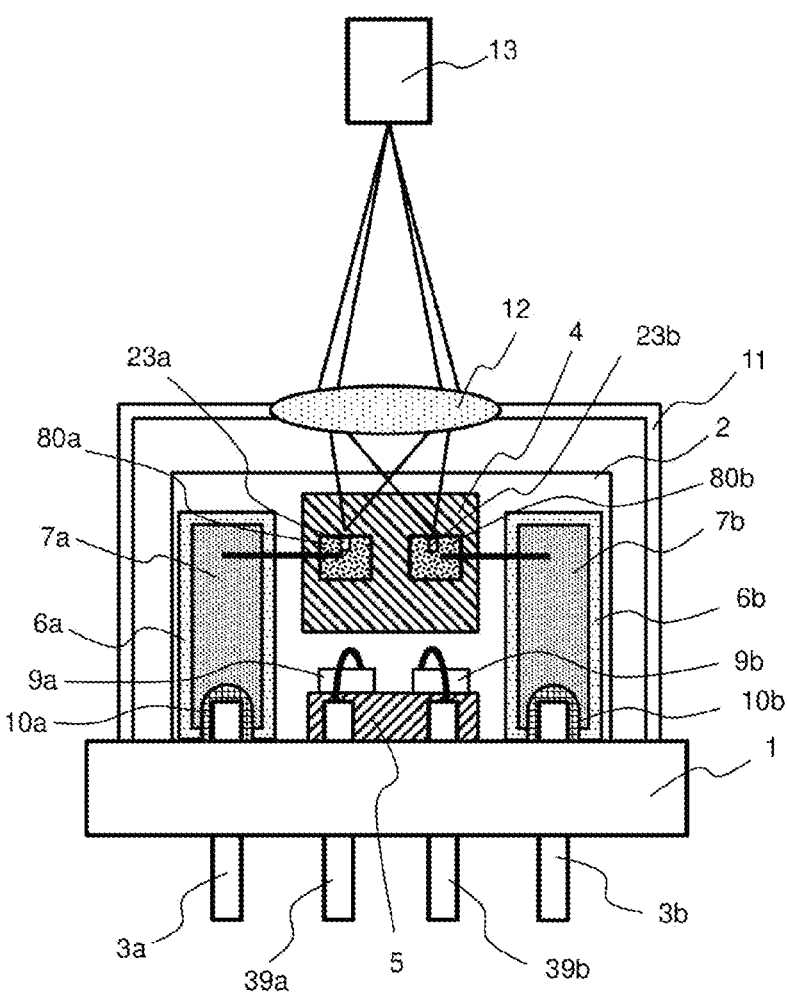
FIG. 3 is a side view showing the internal structure of another optical transmission module according to embodiment 1.
Figure 4:
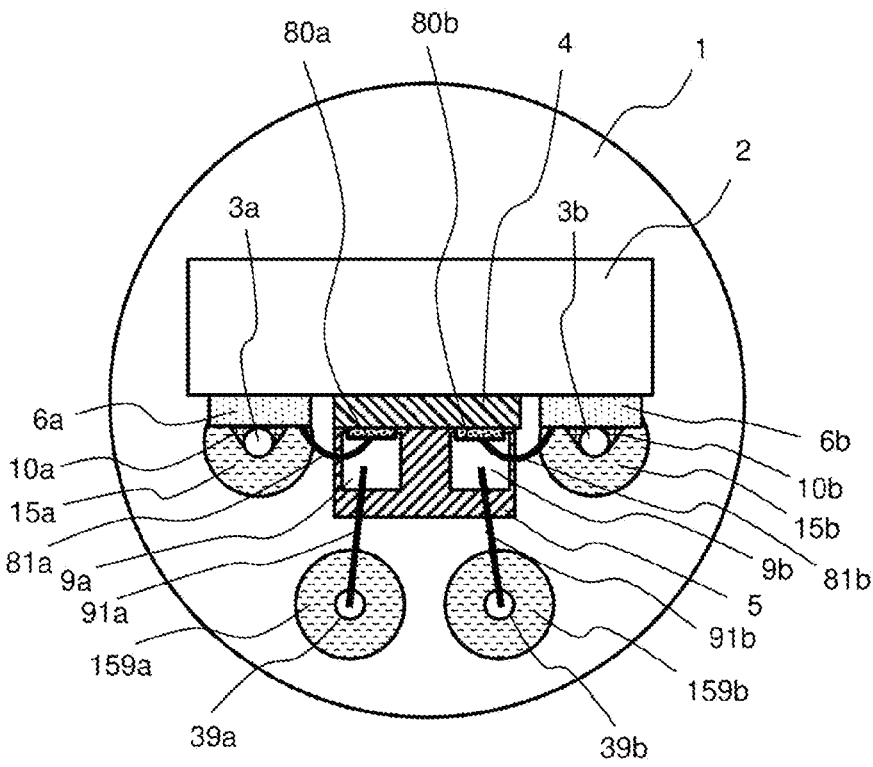
FIG. 4 is a top view showing the internal structure of the other optical transmission module according to embodiment 1.
Figure 5:
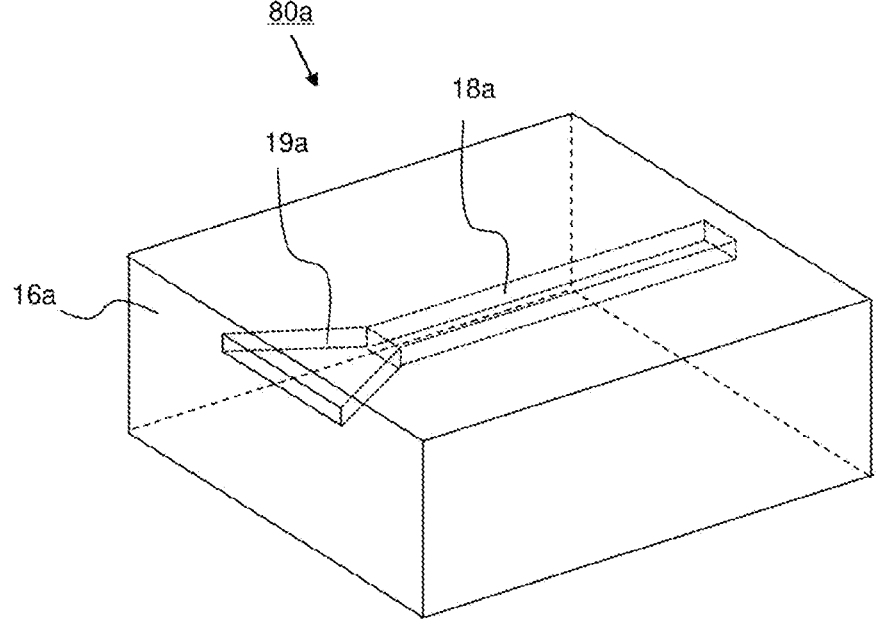
FIG. 5 is a schematic structure view for illustrating a spot-size converter in the optical transmission module according to embodiment 1.

FIG. 3 and FIG. 4 are schematic views showing the structure inside the cap 11 of an optical transmission module having another configuration according to embodiment 1. FIG. 3 is a side view and FIG. 4 is a top view. In the optical transmission module shown in FIG. 3 and FIG. 4, a semiconductor laser 80*a* and a semiconductor laser 80*b* respectively have a spot-size converter (SSC) 23*a* and a spot-size converter 23*b* on front end surface sides thereof. The spot-size converter 23*a* can be formed by providing a taper structure 19*a* at an end of a laser diode area 18*a* of the semiconductor laser 80*a* as shown in FIG. 5, for example. By providing the spot-size converter having the taper structure 19*a* as shown in FIG. 5, a divergence angle of a beam emitted from a front end surface 16*a* of the semiconductor laser 80*a* is narrowed. The semiconductor laser 80*b* also has the same configuration. Thus, the coupling efficiency of beams emitted from the two semiconductor lasers 80*a* and 80*b* into the fiber 13 is improved, or positional accuracy in mounting can be relaxed.

The semiconductor laser according to each embodiment of the present disclosure is not such a laser that a laser beam is outputted and then is modulated by a modulator as in the EML, but is a semiconductor laser for which current for laser oscillation itself is controlled to be modulated. For example, this semiconductor laser is such a type that current for driving a distributed feedback (DFB) laser is directly controlled to be modulated. In general, in the configuration in which drive current for the semiconductor laser is directly controlled to be modulated, voltages at a plus potential and a minus potential with respect to the ground potential, i.e., differential signals, are often applied to a plus electrode and a minus electrode for causing current to flow through the semiconductor laser, thus driving the semiconductor laser. In such a configuration, for driving the semiconductor laser, it is necessary to provide two electric connections on the plus side and the minus side with respect to the ground potential such as the stem, and for electric connection with the outside of the stem, it is necessary to provide two lead pins for one semiconductor laser. In contrast, in the present disclosure, a single-phase electrical signal having one of a plus potential or a minus potential with respect to the ground potential is applied to the semiconductor laser. Therefore, only one lead pin is needed for driving one semiconductor laser, and thus the number of necessary lead pins is small. In addition, as compared to the configuration in which electric connection for driving the semiconductor laser and electric connection for applying an electrical signal for modulation are needed individually as in the EML, the number of lead pins needed for electric connection with the outside of the stem 1 is smaller. Therefore, using the semiconductor lasers and the driving method configured as described in the present disclosure contributes to size reduction in such an optical transmission module in which a plurality of semiconductor lasers are integrated.

As described above, in the optical transmission module according to embodiment 1, the semiconductor lasers are respectively driven by single-phase electrical signals (signals each having only one of plus voltage or minus voltage) with the ground potential of the stem 1 as a reference, from the respective lead pins. That is, single-phase electrical signals are respectively applied to the semiconductor lasers, and currents for oscillation of the semiconductor lasers are controlled, whereby oscillation waveforms of the respective semiconductor lasers are modulated. With this configuration, a plurality of semiconductor lasers having different laser wavelengths are integrated, single-phase signals at different phases are respectively applied to the semiconductor lasers, and the beam outputs of the respective semiconductor lasers are coupled in the fiber 13, whereby the bit rate can be increased by plural times as compared to an optical transmission module including only one semiconductor laser. In addition, in the configuration in which the two semiconductor lasers are arranged, arrangement from one lead pin to one semiconductor laser and arrangement from the other lead pin to the other semiconductor laser are made line-symmetric as seen in the direction perpendicular to the side surface of the block 2 on which the semiconductor lasers are mounted, whereby the impedances from the lead pins to the semiconductor lasers can be made equal to each other. In this configuration, if the two semiconductor lasers having the same laser oscillation wavelength are driven by single-phase signals at the same phase, i.e., the same voltage waveform, the oscillation waveforms also become the same, and thus a laser beam having a doubled output level at this wavelength can be extracted.

Embodiment 2

Figure 6:
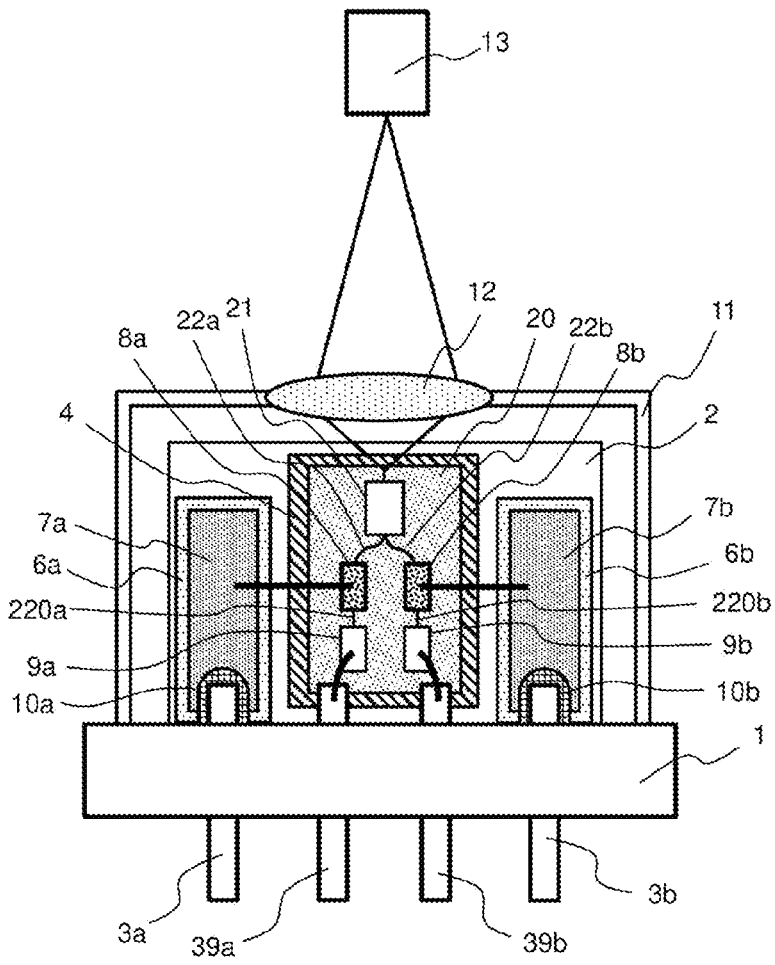
FIG. 6 is a side view showing the internal structure of an optical transmission module according to embodiment 2.
Figure 7:
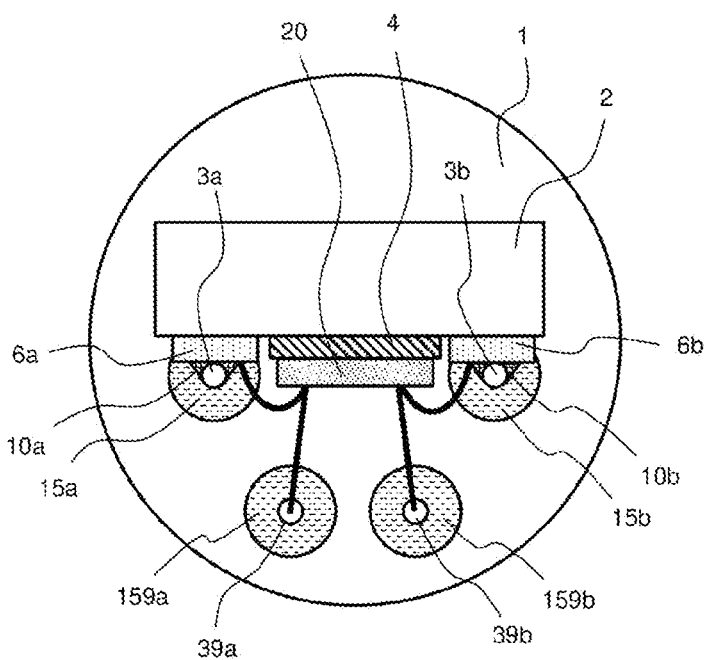
FIG. 7 is a top view showing the internal structure of the optical transmission module according to embodiment 2.

FIG. 6 and FIG. 7 are schematic views showing the structure inside the cap 11 of an optical transmission module according to embodiment 2. FIG. 6 is a side view and FIG. 7 is a top view. In the optical transmission module according to embodiment 2, as in embodiment 1, the block 2 is attached to the stem 1, and the sub-mount 4 is mounted on the side surface of the block 2. A semiconductor integrated element 20 in which two semiconductor lasers 8*a* and 8*b* and two photodiodes 9*a* and 9*b* are integrated, is mounted on the sub-mount 4. On the semiconductor integrated element 20, an optical multiplexer 21, an optical waveguide 22*a*, and an optical waveguide 22*b* are provided. Beams emitted from the front end surfaces of the two semiconductor lasers 8*a* and 8*b* respectively pass through the optical waveguide 22*a* and the optical waveguide 22*b*, to be inputted to the optical multiplexer 21 and multiplexed by the optical multiplexer 21, and then the multiplexed beam is emitted from a front end surface of the semiconductor integrated element 20. Beams emitted from the rear end surfaces of the two semiconductor lasers 8*a* and 8*b* respectively pass through an optical waveguide 220*a* and an optical waveguide 220*b*, to be received by the photodiode 9*a* and the photodiode 9*b*, respectively. On the semiconductor integrated element 20, electrode pads are provided for supplying power to the semiconductor laser 8*a*, the semiconductor laser 8*b*, the photodiode 9*a*, and the photodiode 9*b*. The electrode pads and the lead pins 3*a*, 3*b*, 39*a*, 39*b* are electrically connected via wires, respectively.

In embodiment 1, beams emitted from the rear end surfaces of the semiconductor laser 8*a* and the semiconductor laser 8*b* propagate through a space, to be received by the photodiode 9*a* and the photodiode 9*b*. In such a configuration, optical crosstalk occurs between adjacent lanes, and thus the beam outputs of beams emitted from the respective semiconductor lasers cannot be accurately monitored by the respective photodiodes. In embodiment 2, the semiconductor laser 8*a*, the semiconductor laser 8*b*, the photodiode 9*a*, and the photodiode 9*b* are integrated in one semiconductor integrated element 20, and beams emitted from the rear end surfaces of the semiconductor laser 8*a* and the semiconductor laser 8*b* are propagated while being confined within the optical waveguide 220*a* and the optical waveguide 220*b*, respectively. Thus, crosstalk between adjacent channels can be avoided.

Beams emitted from the front end surfaces of the two semiconductor lasers 8*a* and 8*b* respectively pass through the optical waveguide 22*a* and the optical waveguide 22*b*, to be inputted to the optical multiplexer 21 and multiplexed by the optical multiplexer 21, thus forming one laser beam, which is then emitted toward the lens 12 and enters the fiber 13. In embodiment 1, two laser beams need to be introduced by the lens into one fiber entry end, so that it is necessary to perform adjustment for matching the positions of the two laser beams, whereas in the present embodiment 2, this adjustment is not needed and therefore an optical transmission module that can be easily manufactured is obtained.

Figure 8:
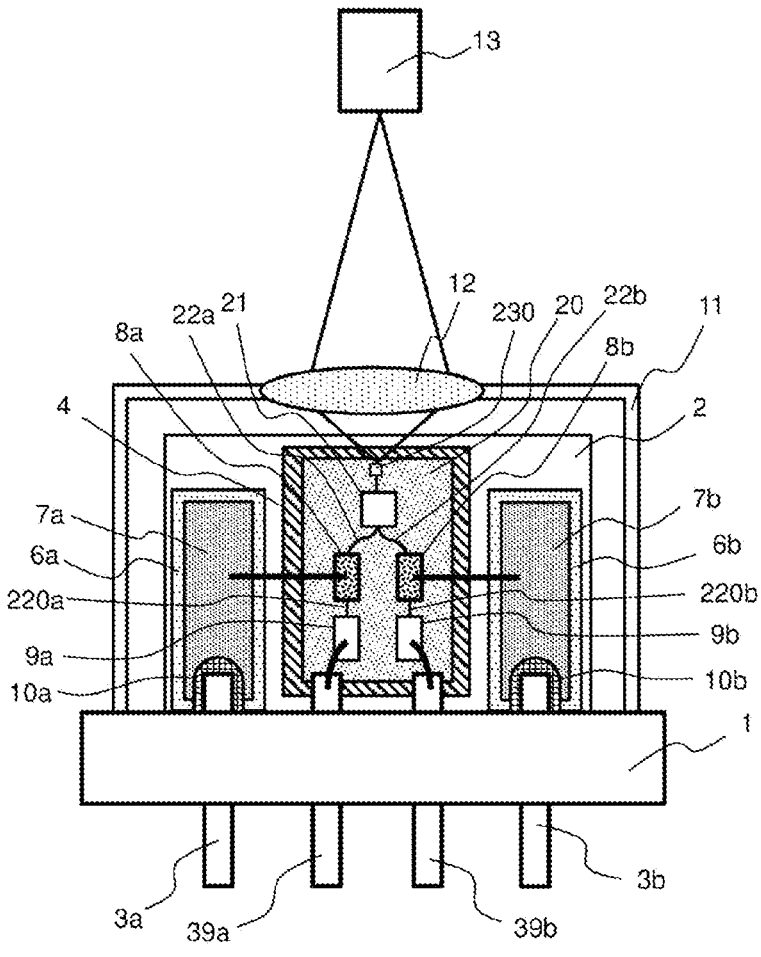
FIG. 8 is a side view showing the internal structure of another optical transmission module according to embodiment 2.
Figure 9:
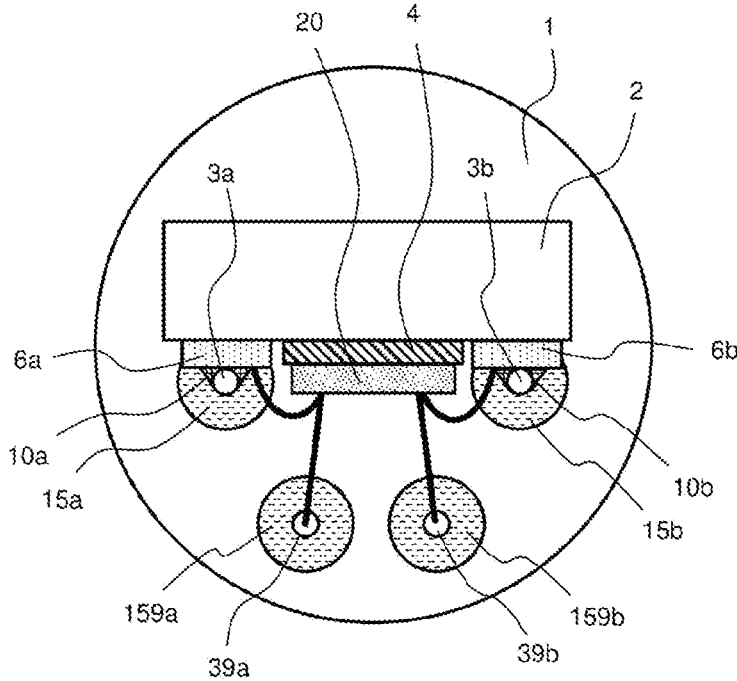
FIG. 9 is a top view showing the internal structure of the other optical transmission module according to embodiment 2.

FIG. 8 and FIG. 9 are schematic views showing the structure inside the cap 11 of an optical transmission module having another configuration according to embodiment 2. FIG. 8 is a side view and FIG. 9 is a top view. In the optical transmission module shown in FIG. 8 and FIG. 9, a spot-size converter 230 for expanding the spot size of the laser beam as with the spot-size converter described in FIG. 5 in embodiment 1 is provided at an emission surface of an optical waveguide where a beam emitted from the optical multiplexer 21 is extracted. Thus, the divergence angle of the beam emitted from the spot-size converter 230 is narrowed, whereby the efficiency of coupling into the fiber 13 can be improved or positional accuracy in mounting can be relaxed.

Embodiment 3

Figure 10:
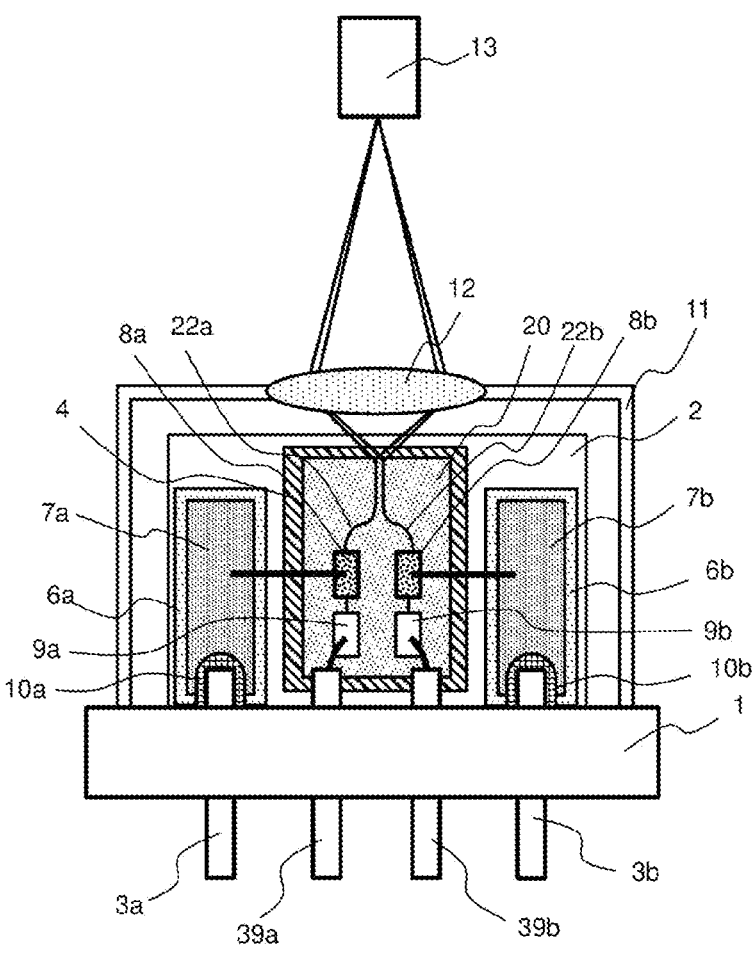
FIG. 10 is a side view showing the internal structure of an optical transmission module according to embodiment 3.
Figure 11:
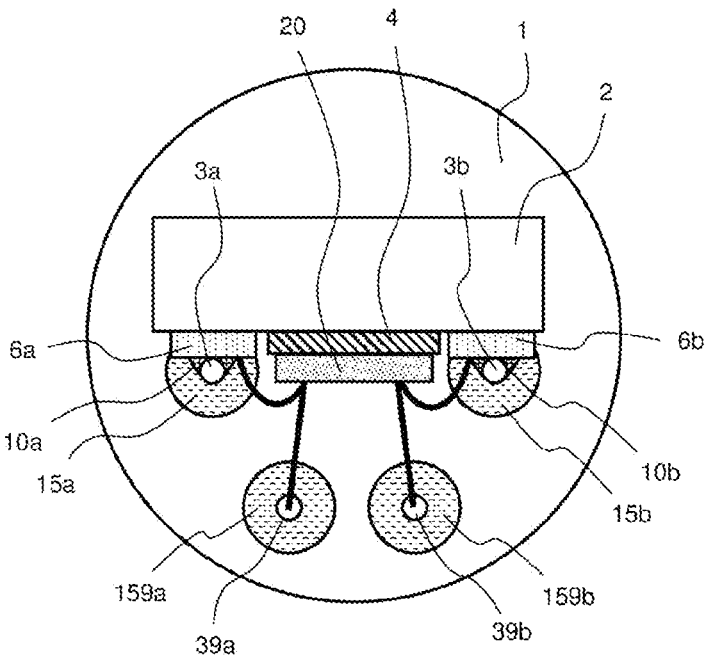
FIG. 11 is a top view showing the internal structure of the optical transmission module according to embodiment 3.

FIG. 10 and FIG. 11 are schematic views showing the structure inside the cap 11 of an optical transmission module according to embodiment 3. FIG. 10 is a side view and FIG. 11 is a top view. In embodiment 3, as in embodiment 1, the stem 1, the block 2, the transmission board 6a, the transmission board 6b, the sub-mount 4, the sub-mount 5, the lead pin 3a, the lead pin 3b, the cap 11, the lens 12, and the like are provided. The semiconductor integrated element 20 in which two semiconductor lasers 8a and 8b and two photodiodes 9a and 9b are integrated is mounted on the sub-mount 4. Unlike embodiment 2, an optical multiplexer is not integrated in the semiconductor integrated element 20. Beams emitted from the front end surfaces of the two semiconductor lasers 8a and 8b respectively propagate through the optical waveguide 22a and the optical waveguide 22b, to be emitted from the front end surface of the semiconductor integrated element 20, and then are focused by the lens 12 onto the entry end of the fiber 13. In embodiment 2, loss due to the optical multiplexer 21 occurs, whereas in embodiment 3, loss due to the optical multiplexer does not occur. Thus, as compared to the optical transmission module according to embodiment 2, power of the beams emitted from the front end surface of the semiconductor integrated element 20 can be improved.

Figure 12:
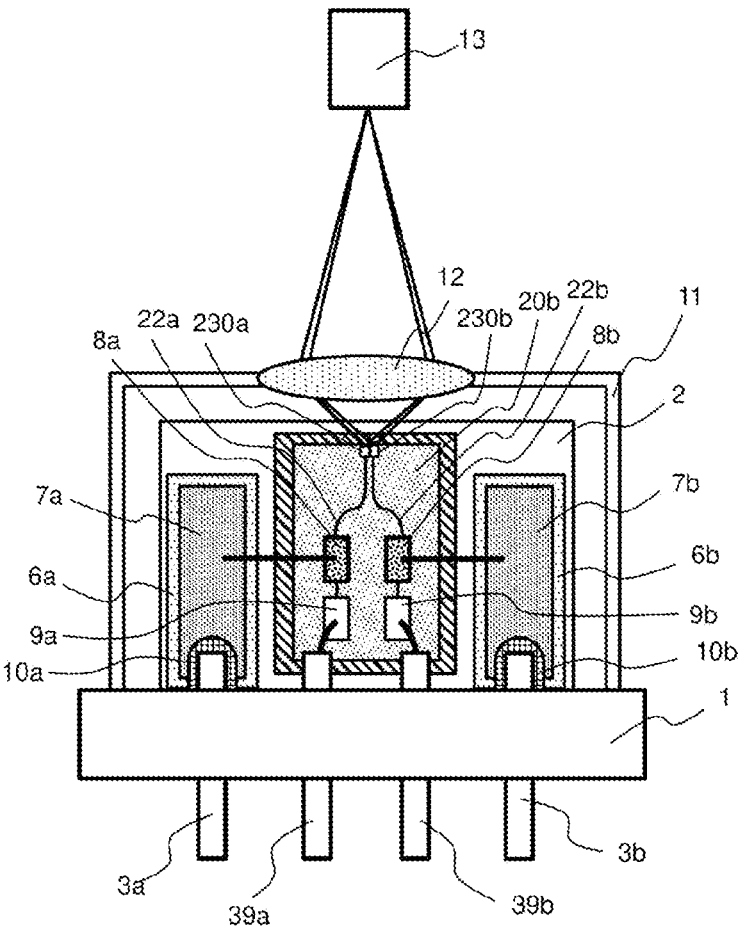
FIG. 12 is a side view showing the internal structure of another optical transmission module according to embodiment 3.
Figure 13:
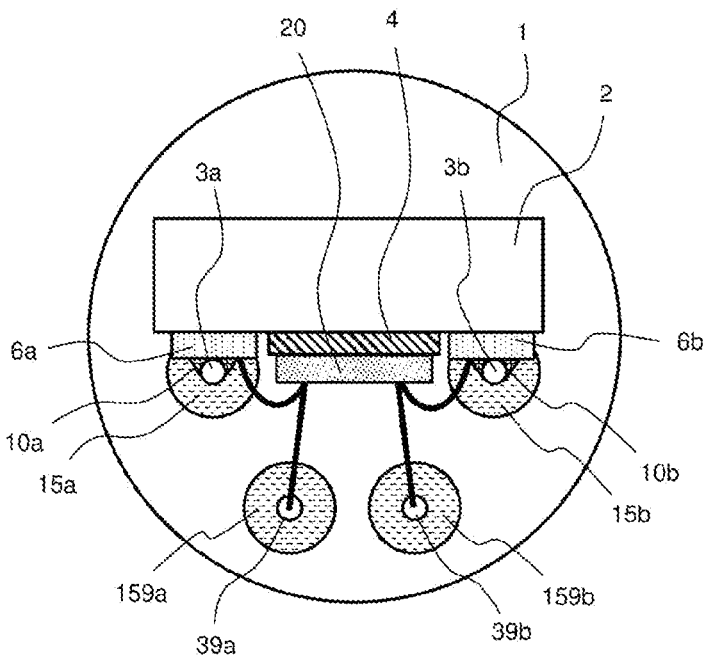
FIG. 13 is a top view showing the internal structure of the other optical transmission module according to embodiment 3.

FIG. 12 and FIG. 13 are schematic views showing the structure inside the cap 11 of an optical transmission module having another configuration according to embodiment 3. FIG. 12 is a side view and FIG. 13 is a top view. In the optical transmission module shown in FIG. 12 and FIG. 13, a spot-size converter 230a and a spot-size converter 230b are provided at respective ends of the optical waveguide 22a and the optical waveguide 22b where beams are emitted from the front end surface of the semiconductor integrated element 20. Thus, the divergence angles of beams emitted from the spot-size converters are narrowed, whereby the efficiency of coupling into the fiber 13 can be improved or positional accuracy in mounting can be relaxed.

Embodiment 4

Figure 14:
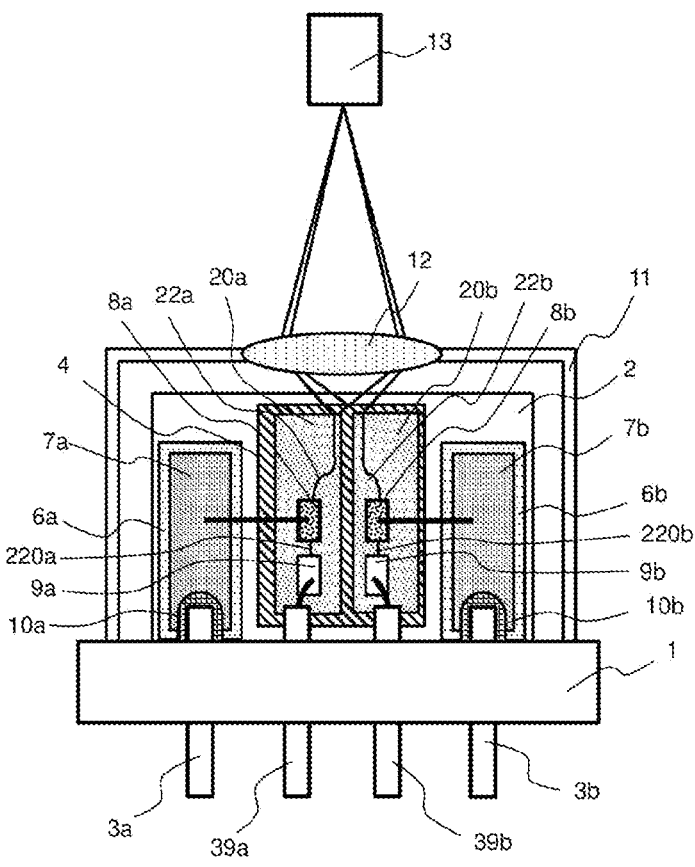
FIG. 14 is a side view showing the internal structure of an optical transmission module according to embodiment 4.
Figure 15:
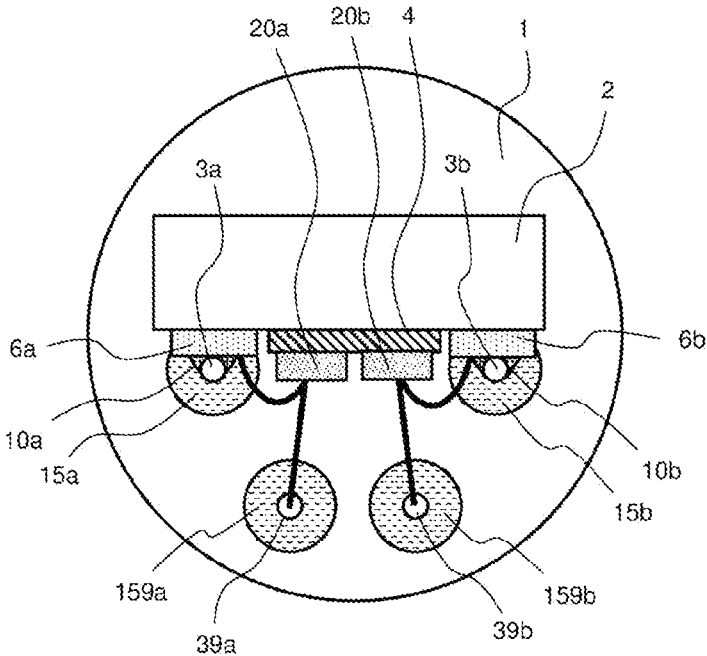
FIG. 15 is a top view showing the internal structure of the optical transmission module according to embodiment 4.

FIG. 14 and FIG. 15 are schematic views showing the structure inside the cap 11 of an optical transmission module according to embodiment 4. FIG. 14 is a side view and FIG. 15 is a top view. In embodiment 4, a semiconductor integrated element 20a in which one semiconductor laser 8a and one photodiode 9a are integrated and a semiconductor integrated element 20b in which one semiconductor laser 8b and one photodiode 9b are integrated, are mounted adjacently to each other on the sub-mount 4 mounted on one side surface of the block 2. Beams emitted from the front end surfaces of the semiconductor laser 8a and the semiconductor laser 8b respectively propagate through the optical waveguide 22a and the optical waveguide 22b respectively integrated on the semiconductor integrated element 20a and the semiconductor integrated element 20b, to be emitted from front end surfaces of the semiconductor integrated element 20a and the semiconductor integrated element 20b, respectively. Beams emitted from the rear end surfaces of the semiconductor laser 8a and the semiconductor laser 8b respectively propagate through the optical waveguide 220a and the optical waveguide 220b, to be received by the photodiode 9a and the photodiode 9b, respectively.

Regarding the manufacturing yield of the semiconductor integrated element, in embodiment 3, manufacturing yields of two semiconductor lasers and two photodiodes are multiplied. On the other hand, in embodiment 4, manufacturing yields of one semiconductor laser and one photodiode are multiplied. Therefore, the influence of manufacturing yields of the semiconductor lasers and the photodiodes can be reduced, whereby the manufacturing yield of the semiconductor integrated element can be improved.

Figure 16:
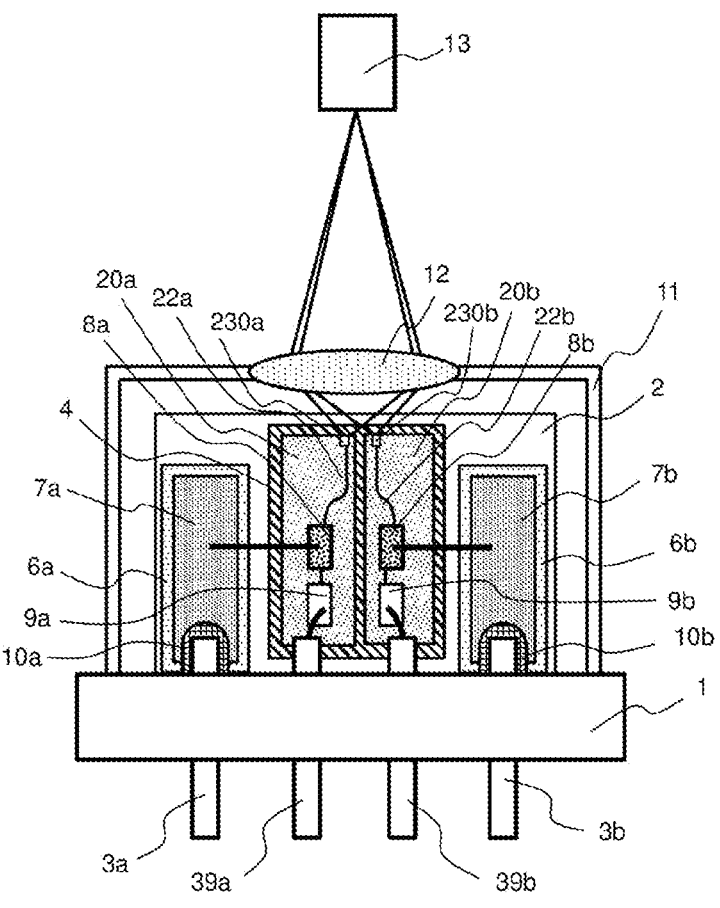
FIG. 16 is a side view showing the internal structure of another optical transmission module according to embodiment 4.
Figure 17:
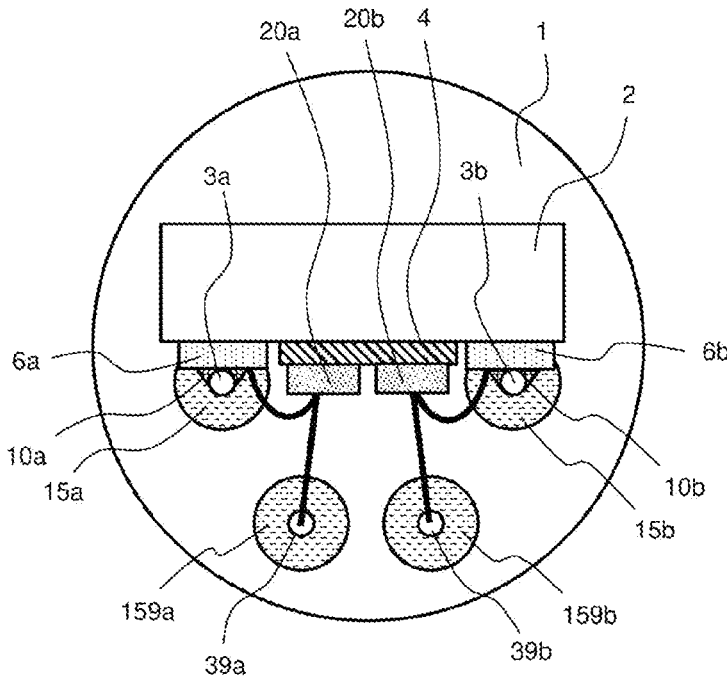
FIG. 17 is a top view showing the internal structure of the other optical transmission module according to embodiment 4.

FIG. 16 and FIG. 17 are schematic views showing the structure inside the cap 11 of an optical transmission module having another configuration according to embodiment 4. FIG. 16 is a side view and FIG. 17 is a top view. In the optical transmission module shown in FIG. 16 and FIG. 17, the spot-size converter 230a and the spot-size converter 230b are provided at respective ends of the optical waveguide 22a and the optical waveguide 22b where beams are emitted from the respective front end surfaces of the semiconductor integrated element 20a and the semiconductor integrated element 20b. Thus, the divergence angles of beams emitted from the spot-size converters are narrowed, whereby the efficiency of coupling into the fiber 13 can be improved or positional accuracy in mounting can be relaxed.

Embodiment 5

Figure 18:
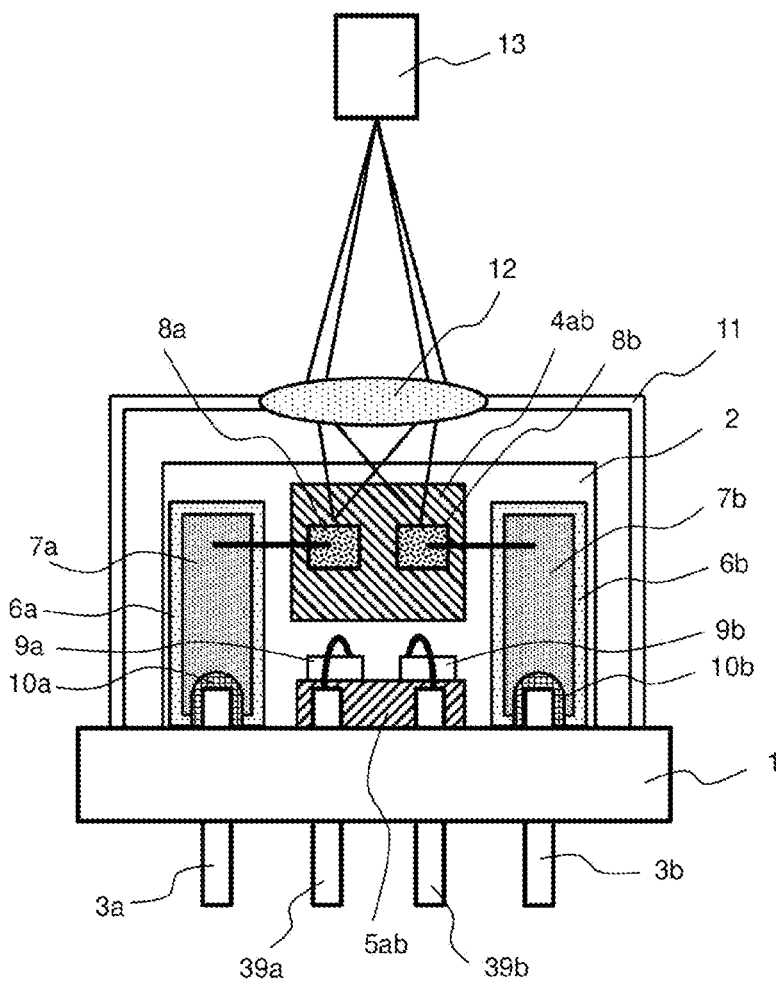
FIG. 18 is a side view showing the internal structure of an optical transmission module according to embodiment 5.
Figure 19:
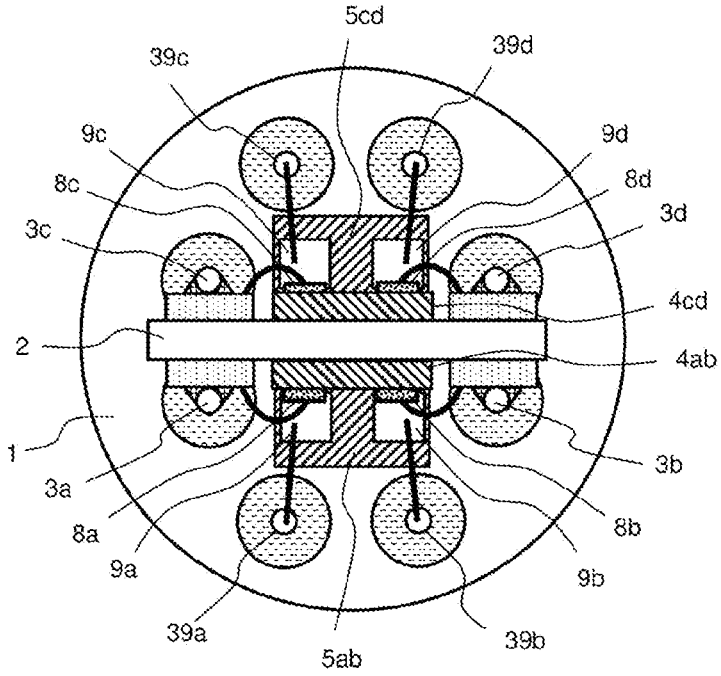
FIG. 19 is a top view showing the internal structure of the optical transmission module according to embodiment 5.

FIG. 18 and FIG. 19 are schematic views showing the structure inside the cap 11 of an optical transmission module according to embodiment 5. FIG. 18 is a side view and FIG. 19 is a top view. In embodiments 1 to 4, a plurality of semiconductor lasers and the like are mounted only on one side surface of the block 2 fixed to the stem 1. On the other hand, in the optical transmission module according to embodiment 5, a plurality of semiconductor lasers are mounted on each of one side surface of the block 2 fixed to the stem 1 and another side surface thereof opposite to the one side surface. That is, on one side surface, a sub-mount 4ab is mounted and two semiconductor lasers 8a and 8b are mounted on the sub-mount 4ab, as in the optical transmission module shown in FIG. 1 and FIG. 2. In addition, two photodiodes 9a and 9b are mounted on a sub-mount 5ab mounted on the stem 1. In addition, the lead pin 3a and lead pin 3b for semiconductor laser and the lead pin 39a and the lead pin 39b for photodiode are provided so as to penetrate the stem 1. On the side surface opposite to the above one side surface, i.e., on the other side surface, the same structure as that on the one side surface is applied. That is, on the other side surface, a sub-mount 4cd is mounted, and two semiconductor lasers 8c and 8d are mounted on the sub-mount 4cd. In addition, on a sub-mount 5cd mounted on the stem 1, two photodiodes 9c and 9d are mounted for detecting laser beams outputted from rear end surfaces of the semiconductor laser 8c and the semiconductor laser 8d, respectively. In addition, a lead pin 3c and a lead pin 3d for semiconductor laser and a lead pin 39c and a lead pin 39d for photodiode are provided so as to penetrate the stem 1. With this configuration, the bit rate can be further doubled as compared to the configurations in embodiments 1 to 4.

FIG. 18 and FIG. 19 show the case where the configuration of the optical transmission module having two semiconductor lasers as described in embodiment 1 is applied to the optical transmission module having four semiconductor lasers. However, as a matter of course, the configuration of the optical transmission module having two semiconductor lasers as described in embodiments 2 to 4 may be applied to the optical transmission module having four semiconductor lasers. Also in such a configuration, the bit rate can be doubled.

Embodiment 6

Figure 20:
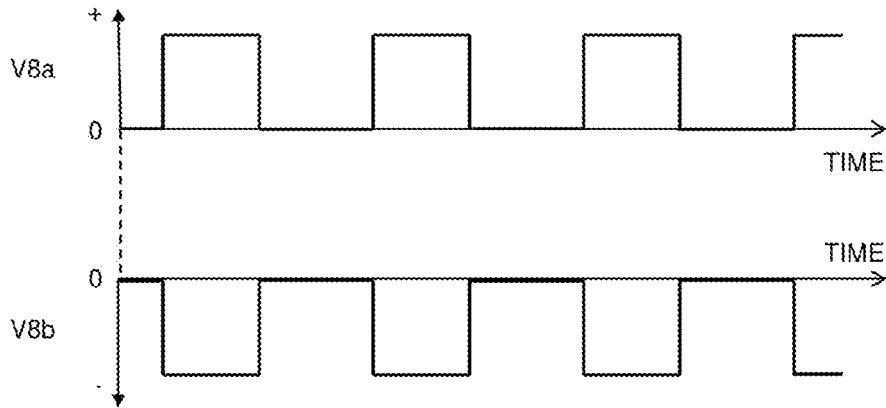
FIG. 20 is a chart showing voltage waveforms for driving two semiconductor lasers of an optical transmission module according to embodiment 6.

FIG. 20 is a chart showing drive waveforms of semiconductor lasers of an optical transmission module according to embodiment 6. For example, in the optical transmission module configured as shown in FIG. 1 and FIG. 2, the semiconductor laser 8a and the semiconductor laser 8b are formed by semiconductor lasers having polarities opposite to each other. That is, if the semiconductor laser 8a is a p-type semiconductor laser, the semiconductor laser 8b is an n-type semiconductor laser. Voltages having voltage waveforms denoted by V8a and V8b in FIG. 20, i.e., voltage waveforms in a mutually differential relationship with respect to the ground potential (a potential shown by 0 in FIG. 20), are applied to the semiconductor laser 8a and the semiconductor laser 8b, respectively.

Alternatively, the polarities of the semiconductor laser 8a and the semiconductor laser 8b are set to be the same, and electrical wirings between the input electrical signals and the ground potential for the respective lasers are set to be opposite to each other. For example, in the configuration shown in FIG. 1 and FIG. 2, the semiconductor laser 8a and the semiconductor laser 8b having the same polarity are mounted such that the cathode of the semiconductor laser 8a is connected to a ground pattern of the sub-mount 4 and the anode of the semiconductor laser 8b is connected to a ground pattern of the sub-mount 4. Further, the wire 81a is connected to the anode of the semiconductor laser 8a and the wire 81b is connected to the cathode of the semiconductor laser 8b. Voltages having voltage waveforms denoted by V8a and V8b in FIG. 20, i.e., voltage waveforms in a mutually differential relationship with respect to the ground potential (a potential shown by 0 in FIG. 20), are applied to the semiconductor laser 8a and the semiconductor laser 8b, respectively.

With the above configuration, if the oscillation wavelengths of the semiconductor laser 8a and the semiconductor laser 8b are the same, the output level of the laser beam outputted from the optical transmission module can be doubled.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF THE REFERENCE CHARACTERS

1 stem
2 block
3a, 3b, 3c, 3d, 39a, 39b, 39c, 39d lead pin
4, 4ab, 4cd, 5, 5ab, 5cd sub-mount
8a, 8b, 8c, 8d, 80a, 80b semiconductor laser
9a, 9b, 9c, 9d photodiode
11 cap
12 lens
21 optical multiplexer
22a, 22b, 220a, 220b optical waveguide
23a, 23b, 230, 230a, 230b spot-size converter

The invention claimed is:

1. An optical transmission module comprising:
a stem having a plate shape and made of metal;
a block fixed to the stem;
a sub-mount fixed to a side surface of the block;
a plurality of semiconductor lasers provided at the sub-mount; and
a cap with a lens fixed thereto, the cap covering all members placed above the stem, wherein
a plurality of lead pins whose number is the same as a number of the plurality of semiconductor lasers are provided so as to respectively penetrate through a plurality of holes formed in the stem,
the plurality of lead pins and the plurality of semiconductor lasers are electrically connected to each other, respectively,
single-phase electrical signals with the stem as a ground potential are respectively applied to the plurality of semiconductor lasers from an external power supply, through the plurality of lead pins, respectively, so as to cause modulation and oscillation of the plurality of semiconductor lasers,
the number of the plurality of semiconductor lasers provided at the side surface of the block is two,
arrangement from one of the lead pins to a corresponding one of the semiconductor lasers and arrangement from the other lead pin to the other corresponding semiconductor laser are line-symmetric as seen in a direction perpendicular to the side surface of the block, to reduce a difference between a value of an impedance from the one of the lead pins and a value of an impedance from the other lead pin,
all oscillation wavelengths of the plurality of semiconductor lasers are the same, and
the single-phase electrical signals at the same phase are respectively applied to the semiconductor lasers.

2. The optical transmission module according to claim 1, further comprising photodiodes for respectively detecting laser beams from rear end surfaces of the plurality of semiconductor lasers, a number of the photodiodes being the same as the number of the plurality of semiconductor lasers.

3. The optical transmission module according to claim 1, wherein
the plurality of semiconductor lasers have, on respective front end surface sides thereof, spot-size converters for expanding spot sizes of laser beams.

4. The optical transmission module according to claim 1, further comprising a plurality of optical waveguides for respectively guiding laser beams outputted from front end surfaces of the plurality of semiconductor lasers, a number of the optical waveguides being the same as the number of the plurality of semiconductor lasers.

5. The optical transmission module according to claim 4, further comprising spot-size converters provided on output sides of respective ones of the plurality of optical wave-guides so as to expand spot sizes of laser beams.

6. The optical transmission module according to claim 4, further comprising an optical multiplexer so that laser beams from the plurality of optical waveguides are coupled by the optical multiplexer.

7. The optical transmission module according to claim 6, further comprising a spot-size converter provided on an output side of the optical multiplexer so as to expand a spot size of a laser beam.

8. The optical transmission module according to claim 1, wherein sub-mounts are respectively fixed to one side surface of the block and another side surface thereof opposite to the one side surface, and a plurality of semiconductor lasers are provided at each of the sub-mounts.

9. The optical transmission module according to claim 1, wherein the two semiconductor lasers are semiconductor lasers having polarities opposite to each other, and the single-phase electrical signals applied to the two semiconductor lasers are voltage signals in a mutually differential relationship with respect to the ground potential.

10. The optical transmission module according to claim 1, wherein the two semiconductor lasers are semiconductor lasers having the same polarity, and the single-phase electrical signals applied to the two semiconductor lasers are voltage signals in a mutually differential relationship with respect to the ground potential.

* * * * *